(12) United States Patent
Takata

(10) Patent No.: US 6,469,928 B2
(45) Date of Patent: Oct. 22, 2002

(54) NONVOLATILE SEMICONDUCTOR MEMORY DEVICE WITH CONCURRENT MEMORY ACCESS AND DATA LOCKING

(75) Inventor: Hidekazu Takata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/820,543

(22) Filed: Mar. 28, 2001

(65) Prior Publication Data

US 2001/0036105 A1 Nov. 1, 2001

(30) Foreign Application Priority Data

Mar. 29, 2000 (JP) ........................................ 2000-092522

(51) Int. Cl.⁷ .............................................. G11C 16/04
(52) U.S. Cl. .............................. 365/185.04; 365/185.11; 365/185.29
(58) Field of Search ................. 365/185.11, 185.01, 365/185.04, 185.26, 189.05, 230.06, 230.08, 218, 185.29

(56) References Cited

U.S. PATENT DOCUMENTS 5,239,505 A * 8/1993 Fazio et al. ................. 365/185
5,245,572 A   9/1993 Kosonocky et al.
5,442,704 A * 8/1995 Holtey ........................ 380/23
5,513,136 A * 4/1996 Fandrich et al. ........ 365/185.04

FOREIGN PATENT DOCUMENTS

| EP | 0 843 316 A2 A3 | 5/1998 |
|---|---|---|
| JP | 05-054682 | 3/1993 |
| JP | 06-180999 | 6/1994 |
| JP | 07-281952 | 10/1995 |
| JP | 10-144086 | 11/1996 |

* cited by examiner

Primary Examiner—David Nelms
Assistant Examiner—Thong Le
(74) Attorney, Agent, or Firm—Morrison & Foerster LLP

(57) ABSTRACT

A nonvolatile semiconductor memory device includes a plurality of memory cell array blocks including a first memory cell array block to which a data write operation is performed or from which a data erasure operation is performed, and a second memory cell array block from which a data read operation is performed concurrently with the data write operation or the data erasure operation to or from the first memory cell array block; and a plurality of block lock setting devices respectively provided in correspondence with the plurality of memory cell array blocks for placing the second memory cell array block into a locked state in which a data write operation to and a data erasure operation from the second memory cell array block is prohibited.

6 Claims, 5 Drawing Sheets

NONVOLATILE SEMICONDUCTOR MEMORY DEVICE WITH CONCURRENT MEMORY ACCESS AND DATA LOCKING

BACKGROUND OF THE INVENTION

1. Field of the Invention

The present invention relates to a nonvolatile semiconductor memory device capable of concurrently electrically performing a data write or erasure operation and a data read operation.

2. Description of the Related Art

In usual operation of a flash EEPROM (one-chip flash EEPROM with simultaneously erasable blocks), a write or erasure operation is performed to or from an arbitrary memory cell block while no other memory cell block is accessed. A write operation usually requires as long a time as several microseconds to ten microseconds, and an erasure operation requires as long a time as several hundred milliseconds to one second. A data write operation and a data erasure operation of a flash EEPROM need to be performed at a higher speed in order to conform to the recent improvement in the operation speed of microprocessors.

For fulfilling such a need, a technology for reading data from an arbitrary memory cell block while writing or erasing data to or from another memory cell block is disclosed in, for example, Japanese Laid-Open Publication No. 6-180999 entitled "Floating gate nonvolatile memory with reading while writing capability", Japanese Laid-Open Publication No. 7-281952 entitled "Nonvolatile semiconductor storage", Japanese Laid-Open Publication No. 5-54682 entitled "Nonvolatile semiconductor memory", and Japanese Laid-Open Publication No. 10-144086 entitled "Non-volatile semiconductor memory device".

A nonvolatile semiconductor memory device disclosed in Japanese Laid-Open Publication No. 10-144086 filed by the assignee of the present application will be described with reference to FIG. 6. FIG. 6 is a block diagram illustrating a circuit structure of a conventional nonvolatile semiconductor memory device 40. The nonvolatile semiconductor memory device 40 includes a one-chip flash EEPROM with simultaneously erasable blocks.

As shown in FIG. 6, the nonvolatile semiconductor memory device 40 includes two write circuits 41 and 42, two sensing amplifiers 43 and 44, a plurality of memory cell array blocks MA (MA1, MA2, . . . , MAk), a plurality of column decoders YD (YD1, YD2, . . . , YDk), two row decoders XD1 and XD2, and a plurality of switching circuits SW (SW1, SW2, . . . , SWk-1).

The write circuit 41 is connected to each of the plurality of column decoders YD1 through YDk via a data bus DB-1. The write circuit 42 is connected to each of the plurality of column decoders YD1 through YDk via a data bus DB-2. The plurality of column decoders YD1 through YDk are each connected to the sensing amplifier 43 through the data bus DB-1. The plurality of column decoders YD1 through YDk are each connected also to the sensing amplifier 44 through the data bus DB-2.

The plurality of memory cell array blocks MA1 through MAk are respectively provided in correspondence with the plurality of column decoders YD1 through YDk.

The write circuits 41 and 42 respectively apply a prescribed high voltage VPP for writing to the data buses DB-1 and DB-2 in a data write operation.

The two data buses DB-1 and DB-2 are provided in order to perform a data read operation in one memory cell array block and a data write operation in another memory cell array block.

The sensing amplifiers 43 and 44 respectively sense and amplify the currents in the data buses DB-1 and DB-2, and output the resultant signals to an external device in a data read operation.

Each memory cell array block MA includes a plurality of word lines and a plurality of bit lines (not shown in FIG. 6). One of the two row decoders (e.g., the row decoder XD1) is connected to one selected word line out of the plurality of word lines in the memory cell array block MA1. The other row decoder (e.g., the row decoder XD2) is connected to one selected word line out of the plurality of word lines in the memory cell array block MAk.

The row decoders XD1 and XD2 each output a prescribed word line selection signal indicating the selected word line in accordance with a signal level of a row selection portion of an input address signal.

The plurality of column decoders YD1, YD2, . . . , YDk each connect a selected bit line to the data bus DB-1 or DB-2 in accordance with a signal level of a column selection portion of the input address signal in a data write operation or a data read operation to or from the corresponding memory cell array block MA.

The plurality of switching circuits SW1, SW2, . . . , SWk-1 are each provided between each two adjacent memory cell array blocks MA to connect these two memory cell array blocks in series. For example, the switching circuit SW1 is provided between the memory cell array blocks MA1 and MA2, and the switching circuit SW2 is provided between the memory cell array blocks MA2 and MA3.

In more detail, the plurality of switching circuits SW1 through SWk-1 each include a plurality of switching devices (not shown in FIG. 6). Each switching device is provided between a word line in one of the corresponding memory cell array blocks MA and a word line in the other of the corresponding memory cell array blocks MA. The plurality of switching devices in each switching circuit are collectively controlled to be either on or off.

By turning off one of the switching circuits SW1 through SWk-1, the entirety of the plurality of memory cell array blocks MA1 through MAk is divided into two memory cell array block regions (i.e., a region including the memory cell array block MA1 and a region including the memory cell array block MAk), which are operable independently. By causing the row decoder XD1 to select one of the word lines in the memory cell array block MA1 and causing the row decoder XD2 to select one of the word lines in the memory cell array block MAk, a read operation and a write or erasure operation can be concurrently performed in the two memory cell array block regions. In addition, independent write operations to the two memory cell array block regions can be concurrently performed.

By turning off a different switching circuit, the number of memory cell array blocks included in each of the two memory cell array block regions can be arbitrarily changed.

However, the conventional nonvolatile semiconductor memory device 40 allows a write operation and an erasure operation to be performed to or from any memory cell array block MA. Accordingly, the conventional semiconductor memory device 40 does not solve a problem which is common to nonvolatile memory devices that the data in the memory cell array block can be inadvertently or illegally rewritten.

SUMMARY OF THE INVENTION

A nonvolatile semiconductor memory device according to the present invention includes a plurality of memory cell array blocks including a first memory cell array block to which a data write operation is performed or from which a data erasure operation is performed, and a second memory cell array block from which a data read operation is performed concurrently with the data write operation or the data erasure operation to or from the first memory cell array block; and a plurality of block lock setting devices respectively provided in correspondence with the plurality of memory cell array blocks for placing the second memory cell array block into a locked state in which a data write operation to and a data erasure operation from the second memory cell array block is prohibited.

In one embodiment of the invention, the plurality of block lock setting devices include floating gate MOS transistors or latch circuits.

In one embodiment of the invention, the nonvolatile semiconductor memory device further includes a memory operation and lock setting control device for performing a data write operation to, a data read operation and a data erasure operation from the first memory cell array block, and causing at least one of the block lock setting devices corresponding to the second memory cell array block to place the second memory cell array block into a locked state in which a data write operation to and a data erasure operation from the second memory cell array block is prohibited.

In one embodiment of the invention, the nonvolatile semiconductor memory device further includes a connection control device which is controlled by a control signal from the memory operation and lock setting control device for controlling a data read operation from the second memory cell array block and a data write operation to the first memory cell array block.

In one embodiment of the invention, the second memory cell array block includes at least one of information for which security is important or information which does not need to be rewritten.

In one embodiment of the invention, the plurality of memory cell array blocks each include a plurality of nonvolatile memory transistors to which information can be electrically written and from which information can be electrically read and erased, the plurality of nonvolatile memory transistors being arranged in a matrix having a plurality of rows and a plurality of columns, each of the plurality of nonvolatile memory transistors having a control gate, a drain and a source; a plurality of word lines each connected to the control gates of the nonvolatile memory transistors of a corresponding row among the plurality of rows; a plurality of bit lines each connected to the drains of the nonvolatile memory transistors of a corresponding column among the plurality of columns; a common source connected to sources of all the plurality of nonvolatile memory transistors; a plurality of row decoders each for outputting a word line selection signal in accordance with a signal level of a row selection signal portion of an input address signal; and a plurality of column decoders each for outputting a bit line selection signal in accordance with a signal level of a column selection signal portion of an input address signal. The plurality of memory cell array blocks include at least three memory cell array blocks.

Thus, the invention described herein makes possible the advantages of providing a nonvolatile semiconductor memory device for preventing data in a memory cell array block to be inadvertently or illegally rewritten.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

Figure 1:
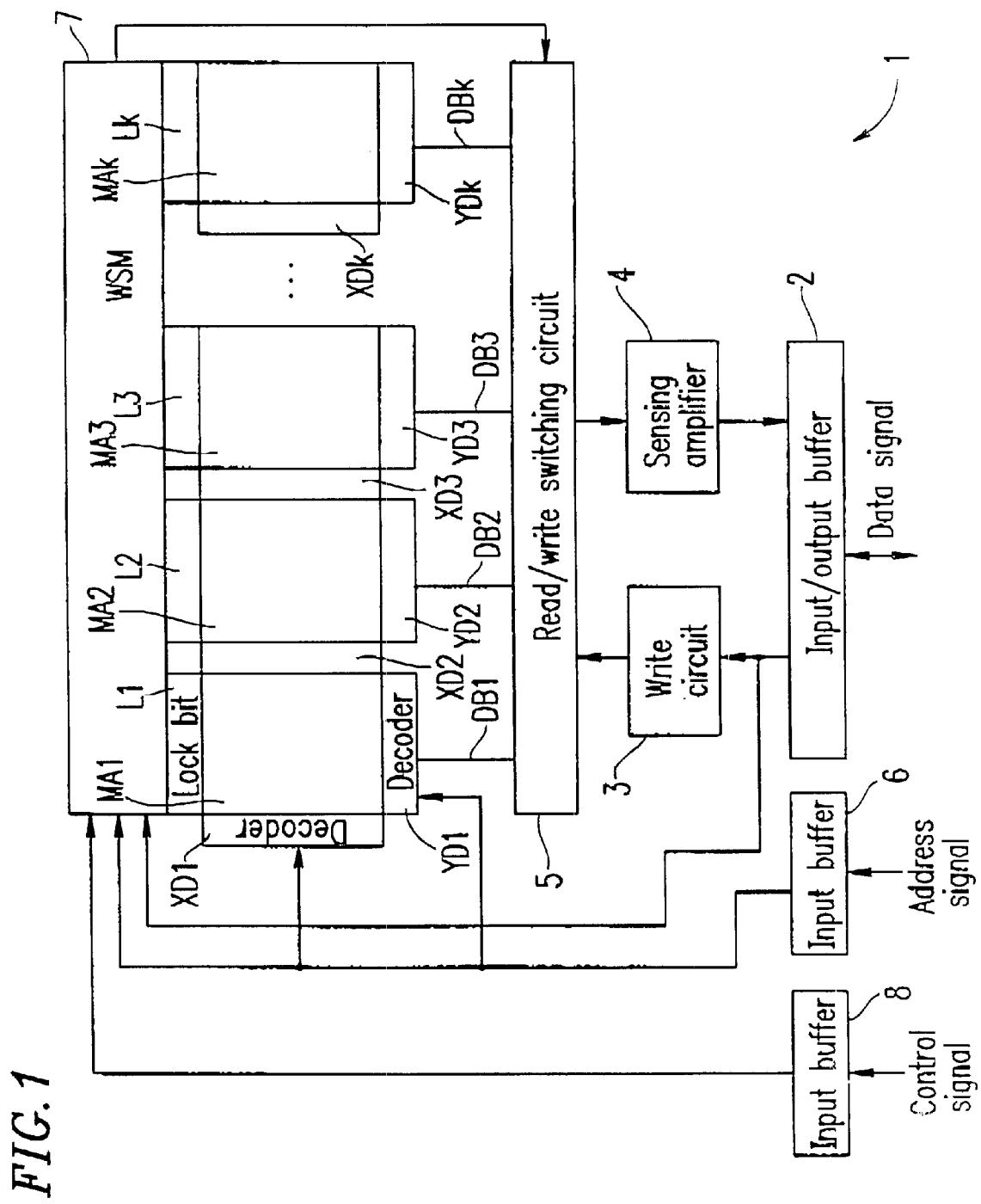
FIG. 1 is a block diagram illustrating a structure of a nonvolatile semiconductor memory device according to one example of the present invention.

FIG. 1 is a block diagram illustrating a structure of a nonvolatile semiconductor memory device 1 according to one example of the present invention.

As shown in FIG. 1, the nonvolatile semiconductor memory device 1 includes an input/output buffer 2 for receiving and outputting a data signal, a write circuit 3 connected to the input/output buffer 2, a sensing amplifier 4 connected to the input/output buffer 2, a read/write switching circuit 5 as a connection control device connected to the write circuit 3 and to the sensing amplifier 4. In more detail, an output of the input/output buffer 2 is connected to a data write input of the write circuit 3. An input of the input/output buffer 2 is connected to a data read output of the sensing amplifier 4. The read/write switching circuit 5 is connected to a data write output of the write circuit 3 and to a data read input of the sensing amplifier 4.

The nonvolatile semiconductor memory device 1 further includes a plurality of data buses DB (DB-1 through DB-k), a plurality of column decoders YD (YD1 through YDk) connected to the read/write switching circuit 5 respectively through the plurality of data buses DB-1 through DB-k, a plurality of memory cell array blocks MA (MA1 through MAk) respectively provided in correspondence with the plurality of column decoders YD1 through YDk, and a plurality of row decoders XD (XD1 through XDk) respectively provided in correspondence with the plurality of memory cell array blocks MA1 through MAk. The plurality of memory cell array blocks MA may be three or more memory cell array blocks MA. In this case, data can be read from one block while data is written into another block, and an OTP block (described below) can be provided.

The nonvolatile semiconductor memory device 1 still further includes an input buffer 6 for receiving an address signal for specifying a memory cell in each memory cell array block. The input buffer 6 is connected to each of the plurality of column decoders YD1 through YDk and to each of the plurality of row decoders XD1 through XDk. In FIG.

1, the input buffer 6 is shown as connected to only the column decoder YD1 and to the row decoder XD1 for the sake of simplicity.

In the following description, a first memory cell array block will be referred to as the "first memory cell array block MAx". A data bus connected to the first memory cell array block MAx will be referred to as the "data bus DBx". A second memory cell array block which is different from the first memory cell array block MAx will be referred to as the "second memory cell array block MAy". A data bus connected to the second memory cell array block MAy will be referred to as the "data bus DBy". The first memory cell array block MAx and the second memory cell array block MAy can be arbitrary ones of the plurality of memory cell array blocks (MA1 through MAk).

The write circuit 3 outputs a write signal (a prescribed high voltage VPP for writing) to the read/write switching circuit 5 in a data write operation.

The sensing amplifier 4 senses a read current from the read/write switching circuit 5, and amplifies and outputs the data current to the input/output buffer 2 in a data read operation.

The read/write switching circuit 5 is controlled by a memory operation control signal sent from a write state machine 7 (described below) and performs connection control for a data read operation and a data write or erasure operation. For example, the read/write switching circuit 5 connects the data bus DBx with the sensing amplifier 4 and also connects the data bus DBy with the write circuit 3 in order to concurrently perform a data read operation and a data write operation.

Figure 3:
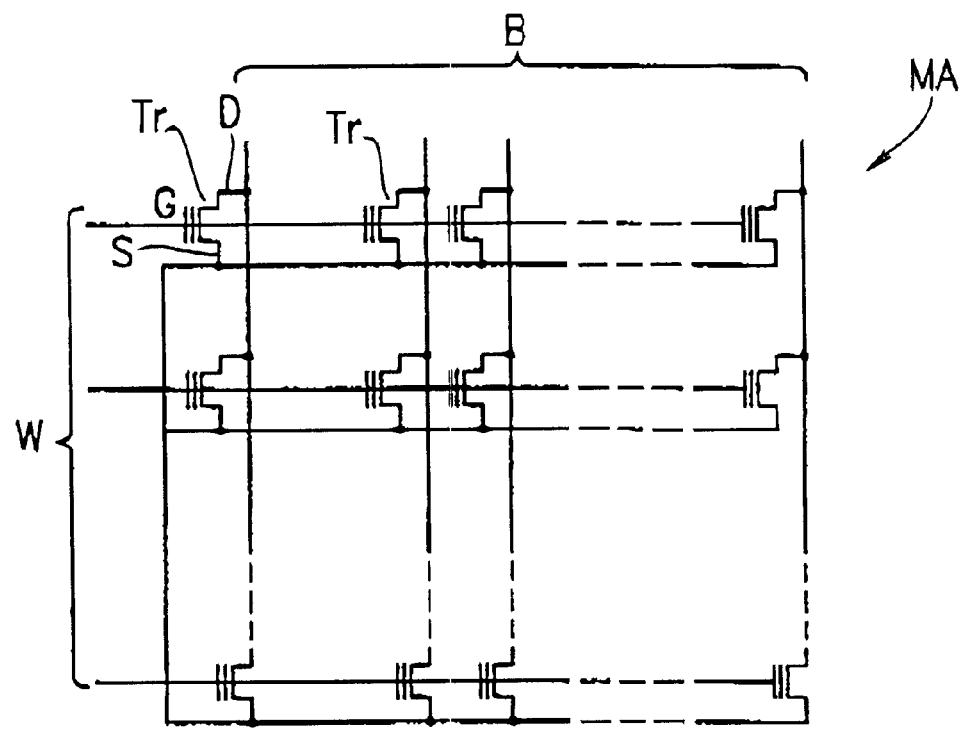
FIG. 3 is a circuit diagram of each memory cell array block included in the nonvolatile semiconductor memory device shown in FIG. 1.

FIG. 3 is a circuit diagram of each of the plurality of memory cell array blocks MA. As shown in FIG. 3, each memory cell array block MA includes a plurality of word lines W, a plurality of bit lines B, and a plurality of floating gate MOS transistors Tr (as memory cells) respectively provided in the vicinity of intersections of the word liens W and the bit lines B. As such, the floating gate MOS transistors Tr are arranged in a matrix. Control gates G of the transistors Tr of an identical row are connected to an identical word line W, and drains D of the transistors Tr of an identical column are connected to an identical word line B. Sources S of all of the transistors Tr are connected together to form a common source.

Each of the plurality of column decoders YD (FIG. 1) has an output thereof connected to one of the plurality of bit lines B in the corresponding memory cell array block MA so as to connect the one bit line to the corresponding data bus DB (i.e., each column decoder YD outputs a prescribed bit line selection signal). The one bit line for inputting or outputting data is selected based on a signal level of a column selection portion of an input address signal for specifying a memory cell in the corresponding memory cell array block MA.

Each of the plurality of row decoders XD has an output thereof connected to one of the plurality of word lines W in the corresponding memory cell array block MA (i.e., each row decoder XD outputs a prescribed word line selection signal, i.e., a signal for controlling the transistors Tr so as to be either on or off) in a data write operation or a data read operation to or from the corresponding memory cell array block MA. The one word line is selected based on a signal level of a row selection portion of the address signal.

The common source of each memory cell array block MA is supplied with a prescribed voltage for reading, writing or erasing data (ground voltage for writing or reading data, and high voltage VHH for erasing data). Each of the plurality of bit lines B is supplied with a high voltage VPP for writing data.

Figure 4:
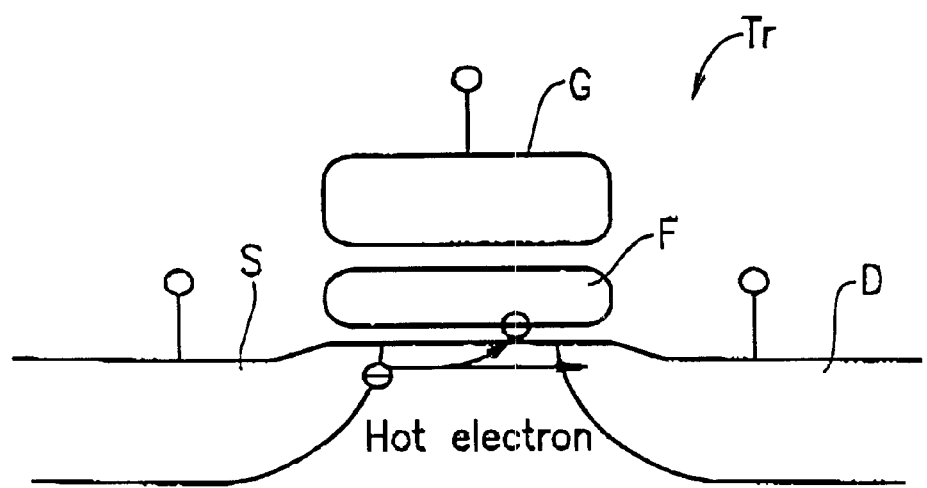
FIG. 4 shows a write operation of a nonvolatile memory transistor included in the memory cell array block shown in FIG. 1.
Figure 5:
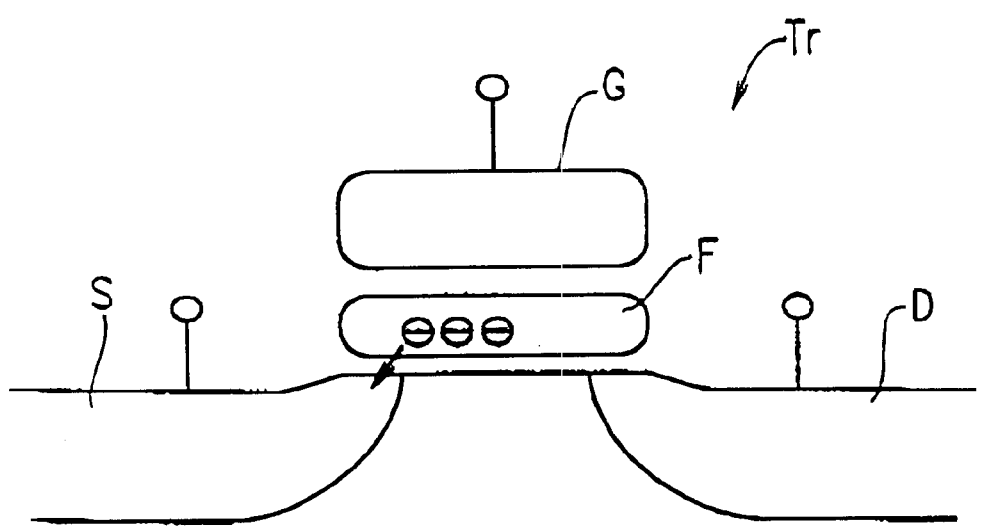
FIG. 5 shows an erasure operation of a nonvolatile memory transistor included in the memory cell array block shown in FIG. 1.
Figure 6:
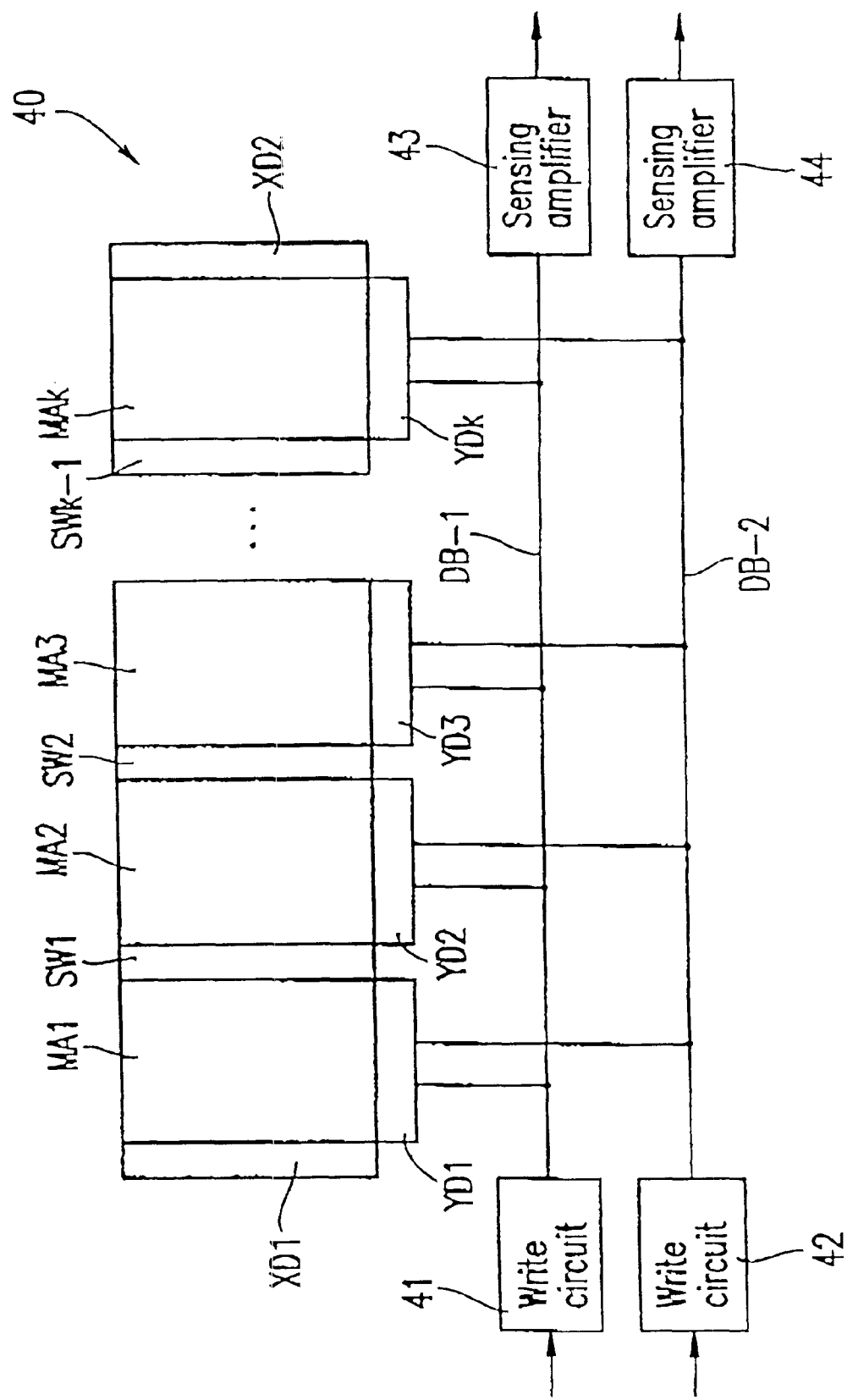
FIG. 6 is a block diagram illustrating a structure of a conventional nonvolatile semiconductor memory device.

FIG. 4 schematically shows a write operation of each floating gate MOS transistor Tr. As shown in FIG. 4, the transistor Tr includes a floating gate F below the control gate G. The writing operation is performed by injecting channel hot electrons, which have obtained high energy due to the high electric field in the vicinity of the drain D, to the floating gate F. FIG. 5 shows an erasure operation of each floating gate MOS transistor Tr. As shown in FIG. 5, the erasure operation is performed by tunnel erasure by a Fowler-Nordheim current from the floating gate F to the source S.

Returning to FIG. 1, the nonvolatile semiconductor memory device 1 also includes the write state machine (WSM) 7 (mentioned above) as a memory operation and lock setting control device, and a plurality of block lock setting sections L (L1 through Lk). The write state machine 7 is connected to the input/output buffer 2, the input buffer 6, and an input buffer 8. The input buffer 8 receives various control signals for a memory operation and a lock setting operation. The various control signals include, for example, a block lock command signal, a block lock address signal, and a memory command signal (i.e., a read/write signal or an erasure signal).

The block lock setting sections L1 through Lk are respectively provided in correspondence with the memory cell array blocks MA1 through MAk, and have a structure similar to that of the memory cell array block MA using the floating gate MOS transistors Tr. The block lock setting sections L1 through Lk places the corresponding memory cell array block MA into a locked state in which a data write operation to a data erasure operation from the corresponding memory cell array block MA is prohibited by a lock bit.

The write state machine 7 acts as a small CPU (central processing unit) and performs a memory operation and a lock setting operation based on a prescribed instruction.

As the memory operation, the write state machine 7 writes data to, erases data from, or reads data from a memory cell array block MA. Data is written to or read from each of the memory cells in each memory cell array block MA, whereas data is erased from the entirety of each memory cell array block MA.

As the lock setting operation, the write state machine 7 causes each block lock setting section L to place the corresponding memory cell array block MA into a locked state by a lock bit. By the lock setting operation, the arbitrary memory cell array block MA can be set as an OTP (one time programmable) region, in which data stored is prohibited from being rewritten or erased. At least one memory cell array block MA can be set as on OTP region. Data stored in the OTP region can be read. Data can be freely written or erased to or from the memory cell array blocks other than the OTP region. In an OTP region, information for which security is important or information which does not need to be rewritten is protected once they are written once.

The nonvolatile semiconductor memory device 1 operates in the following manner.

First, a data signal to be written is input to the input/output buffer 2. The data signal is input to the read/write switching circuit 5 through the write circuit 3. At this point, an address signal for specifying a memory cell is input to the plurality of column decoders YD and the plurality of row decoders XD through the input buffer 6. The data signal and the address signal are also input to the write state machine 7. A read/write signal as one of the various control signals is also input to the write state machine 7 from the input buffer 8.

In accordance with a signal level of a column selection portion of the address signal, each column decoder YD connects a prescribed bit line of each of the selected memory cell array blocks (for example, two selected memory cell array blocks MAx and MAy) to the corresponding data bus DB. In accordance with a signal level of a row selection portion of the address signal, each row decoder XD outputs a word line selection signal of each of the selected memory cell array blocks MAx and MAy.

The write state machine 7 decodes the read/write signal to control the read/write switching of the read/write switching circuit 5. Such a switching operation, for example, allows a data read operation and a data write operation to be concurrently performed. More specifically, when, for example, the data bus DBx connected to a first memory cell array block MAx is connected to the sensing amplifier 4 and the data bus DBy connected to a second memory cell array block MAy is connected to the write circuit 3 both by the read/write switching circuit 5, a data read operation from the first memory cell array block MAx and a data write operation to the second memory cell array block MAy can be concurrently performed.

As a command signal for writing, erasing or reading data to or from an OTP region, a command which is different from a command for writing, erasing or reading data to or from memory cell array blocks other than the OTP region is used.

Figure 2:
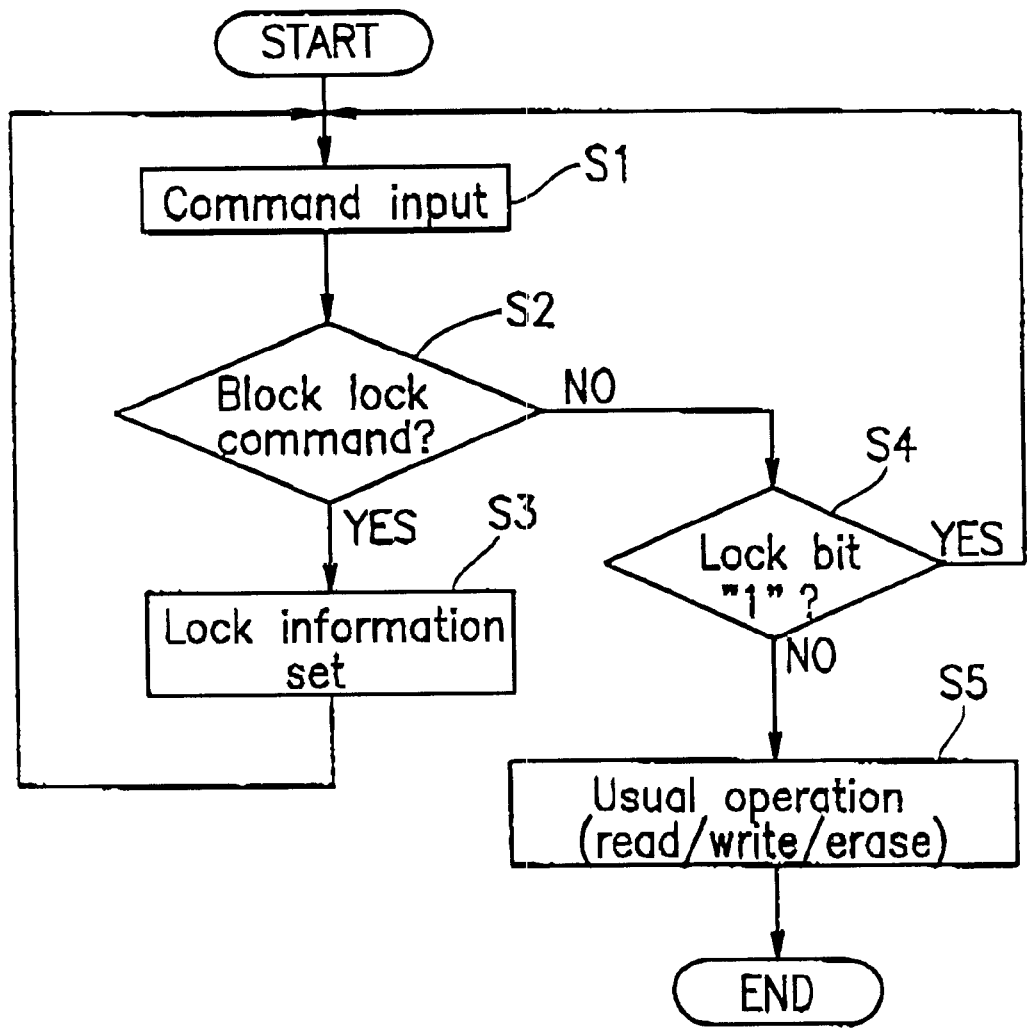
FIG. 2 is a flowchart illustrating an operation of prohibiting a data write operation and a data erasure operation performed in the nonvolatile semiconductor memory device shown in FIG. 1.

An operation for prohibiting a data write operation and a data erasure operation which is performed after the data is written in an OTP region will be described with reference to FIG. 2.

In step S1, a block lock command signal is input to the write state machine 7 (FIG. 1). In step S2, the write state machine 7 determines whether the input signal is a block lock command signal or not. When the signal is determined to be a block lock command signal, the processing advances to step S3. In step S3, a lock bit is set in the block lock setting section L of the memory cell array block MA indicated by a block lock address signal which is input to the write state machine 7 together with the block lock command signal. When the lock bit is set in this manner, the value of the lock bit becomes "1", which means that the memory cell array block MA is in a locked state.

When, in step S2, the signal is determined not to be a block lock command signal, it is determined in step S4 whether the lock bit is "1" or not. When the lock bit is determined to be "1", the processing returns to step S1. Until the memory cell array block MA is released from the locked state, a data write operation and a data erasure operation to and from this memory cell array block MA are prohibited.

When the lock bit is determined not to be "1" in step S4, the nonvolatile semiconductor memory device 1 is controlled to return to the usual memory operation in step S5.

During the above-described prohibition operation, a data reading operation from the OTP region is freely performed as for the other memory cell array blocks MA. The data can be read from the OTP region while data is written to the other memory cell array blocks MA. Accordingly, a data write or erasure operation to or from a first memory cell array block MAx can be performed concurrently with a data read operation from a second memory cell array block MAy.

When a block lock command is input after data is written to a memory cell array block MAy, a data write operation and a data erasure operation to or from the memory cell array block MAy is prohibited. Thus, the information for which security is important or information which does not need to be rewritten is protected. Before the block lock command signal is input, data can be written and rewritten any number of times.

As described above, in a nonvolatile semiconductor memory device according to the present invention, a data read operation from an arbitrary memory cell array block and a data write or erasure operation to or from another memory cell array block can be concurrently performed on one chip. Moreover, when a block lock setting section places the memory cell array block into a locked state, data stored in the memory cell array block corresponding to the block lock setting section is prohibited from being rewritten or erased, and thus is protected. Such a locking system is useful for information which should not be inadvertently or illegally rewritten or information which does not need to be rewritten. Such data can be freely read. While the data stored is locked in such a memory cell array block, data can be written from, read to, or erased from the other memory cell array blocks.

In the above example, the block lock setting section L is formed of a floating gate MOS transistor. Alternatively, the block lock setting section L is formed of a latch circuit for setting a bit in a register.

In the above example, each memory cell array block selectively applies a prescribed voltage for reading, erasing or writing data (ground voltage for writing and reading, and high voltage VHH for erasing) to the common source. The present invention is not limited to such a system, but is also applicable to a system of applying a word line selection signal having a negative voltage to a control gate of the MOS transistor and applying a ground voltage to the common source for erasing data, or to a channel erasure system of pulling charges to a plane between a floating gate and a channel separated from each other by an insulating layer.

As described above, according to the present invention, a data write or erasure operation to or from one memory cell array block and a data read operation from another memory cell array block can be concurrently performed in one chip.

Further according to the present invention, the memory operation and lock setting control device easily causes a block lock setting device to place the corresponding memory cell array block into a locked state in which a data write operation to or a data erasure operation from the memory cell array block is prohibited. Data stored in such a memory cell array block is prohibited from being inadvertently or illegally rewritten or erased. This is useful for storing information for which security is important or information which does not need to be rewritten. Information which does not need to be rewritten is, for example, BIOS (basic input-output system) information.

Data can be read from the memory cell array block in a locked state while data is written to another memory cell array block which is not in a locked state.

In an embodiment where the plurality of block lock setting devices include floating gate MOS transistors or latch circuits, block lock setting devices can be configured to have a simple structure.

In an embodiment where a memory operation and lock setting control device is provided, the memory cell array block can be placed into a locked state easily.

The present invention is applicable to a memory device including nonvolatile memory transistors arranged in a matrix as memory cells.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A nonvolatile semiconductor memory device, comprising:

a plurality of memory cell array blocks including a first memory cell array block to which a data write operation is performed or from which a data erasure operation is performed, and a second memory cell array block from which a data read operation is performed concurrently with the data write operation or the data erasure operation to or from the first memory cell array block; and a plurality of block lock setting devices respectively provided in correspondence with the plurality of memory cell array blocks for placing the second memory cell array block into a locked state in which a data write operation to and a data erasure operation from the second memory cell array block is prohibited.

2. A nonvolatile semiconductor memory device according to claim 1, wherein the plurality of block lock setting devices include floating gate MOS transistors or latch circuits.

3. A nonvolatile semiconductor memory device according to claim 1, further comprising a memory operation and a lock setting control device for performing a data write operation to, a data read operation and a data erasure operation from the first memory cell array block, and causing at least one of the block lock setting devices corresponding to the second memory cell array block to place the second memory cell array block into a locked state in which a data write operation to and a data erasure operation from the second memory cell array block is prohibited.

4. A nonvolatile semiconductor memory device according to claim 3, further comprising a connection control device which is controlled by a control signal from the memory operation and lock setting control device for controlling a data read operation from the second memory cell array block and a data write operation to the first memory cell array block.

5. A nonvolatile semiconductor memory device according to claim 1, wherein the second memory cell array block includes at least one of information for which security is important or information which does not need to be rewritten.

6. A nonvolatile semiconductor memory device according to claim 1, wherein the plurality of memory cell array blocks each include:

a plurality of nonvolatile memory transistors to which information can be electrically written and from which information can be electrically read and erased, the plurality of nonvolatile memory transistors being arranged in a matrix having a plurality of rows and a plurality of columns, each of the plurality of nonvolatile memory transistors having a control gate, a drain and a source;

a plurality of word lines each connected to the control gates of the nonvolatile memory transistors of a corresponding row among the plurality of rows;

a plurality of bit lines each connected to the drains of the nonvolatile memory transistors of a corresponding column among the plurality of columns;

a common source connected to sources of all the plurality of nonvolatile memory transistors;

a plurality of row decoders each for outputting a word line selection signal in accordance with a signal level of a row selection signal portion of an input address signal; and a plurality of column decoders each for outputting a bit line selection signal in accordance with a signal level of a column selection signal portion of an input address signal, wherein the plurality of memory cell array blocks include at least three memory cell array blocks.

* * * * *

UNITED STATES PATENT AND TRADEMARK OFFICE
CERTIFICATE OF CORRECTION

PATENT NO. : 6,469,928 B2
DATED : October 22, 2002
INVENTOR(S) : Hidekazu Takata It is certified that error appears in the above-identified patent and that said Letters Patent is hereby corrected as shown below:

Column 6,
Line 34, insert -- and -- between "to" and "a".

Signed and Sealed this

Twenty-fifth Day of February, 2003

JAMES E. ROGAN
*Director of the United States Patent and Trademark Office*